US011302244B2

(12) United States Patent
Chaji

(10) Patent No.: US 11,302,244 B2
(45) Date of Patent: Apr. 12, 2022

(54) REPAIR TECHNIQUES FOR MICRO-LED DEVICES AND ARRAYS

(71) Applicant: VueReal Inc., Waterloo (CA)

(72) Inventor: Gholamreza Chaji, Waterloo (CA)

(73) Assignee: VUEREAL INC., Waterloo (CA)

( * ) Notice: Subject to any disclaimer, the term of this patent is extended or adjusted under 35 U.S.C. 154(b) by 644 days.

(21) Appl. No.: 16/126,684

(22) Filed: Sep. 10, 2018

(65) Prior Publication Data

US 2019/0080970 A1 Mar. 14, 2019

Related U.S. Application Data

(60) Provisional application No. 62/556,608, filed on Sep. 11, 2017.

(51) Int. Cl.
*G09G 3/32* (2016.01)
*G09G 3/20* (2006.01)
*H01L 21/66* (2006.01)
*H01L 33/50* (2010.01)
*H01L 25/075* (2006.01)

(52) U.S. Cl.
CPC ............. *G09G 3/32* (2013.01); *G09G 3/2014* (2013.01); *H01L 22/24* (2013.01); *H01L 33/502* (2013.01); *G09G 3/2003* (2013.01); *G09G 2300/0452* (2013.01); *G09G 2310/0264* (2013.01); *H01L 25/0753* (2013.01); *H01L 2933/0041* (2013.01)

(58) Field of Classification Search
CPC ....................................................... G09G 3/32
See application file for complete search history.

(56) References Cited

U.S. PATENT DOCUMENTS

2017/0180659 A1* 6/2017 Levoy .................. H04N 17/002
2019/0229149 A1* 7/2019 Yoo ........................ H01L 27/156

\* cited by examiner

*Primary Examiner* — Marvin Payen
(74) *Attorney, Agent, or Firm* — Nixon Peabody LLP

(57) ABSTRACT

What disclosed are structures and methods for repairing emissive display systems. Various repairing techniques embodiments in accordance with the structures and methods are provided to conquer and mitigate the defected pixels and to increase the yield and reduce the cost of emissive displays systems.

5 Claims, 16 Drawing Sheets

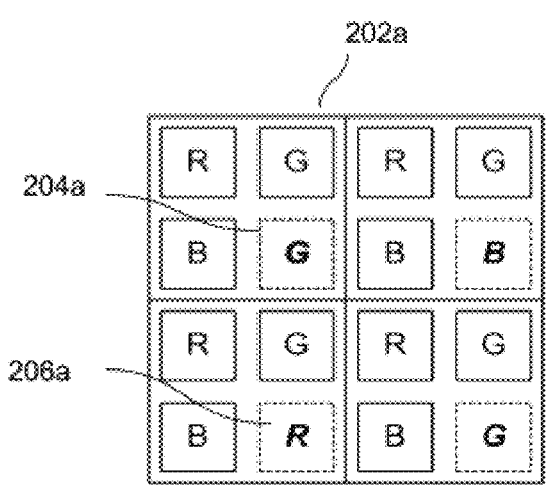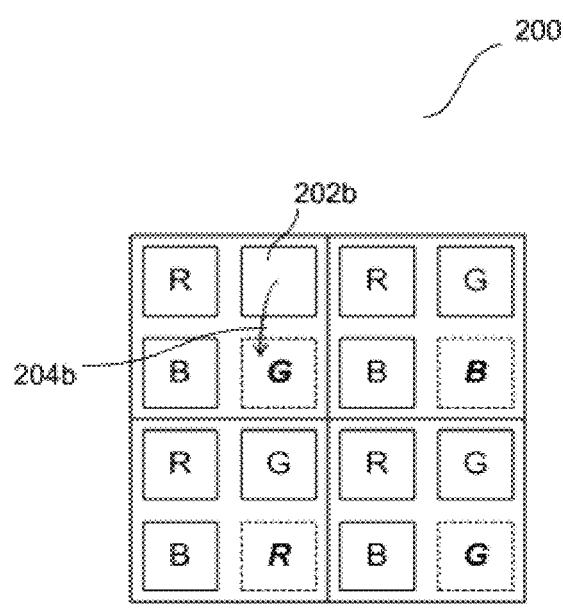
FIG. 2 (a)   FIG. 2 (b)

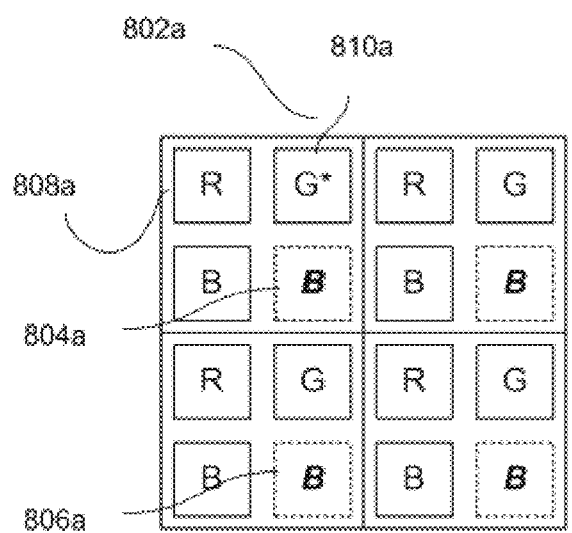
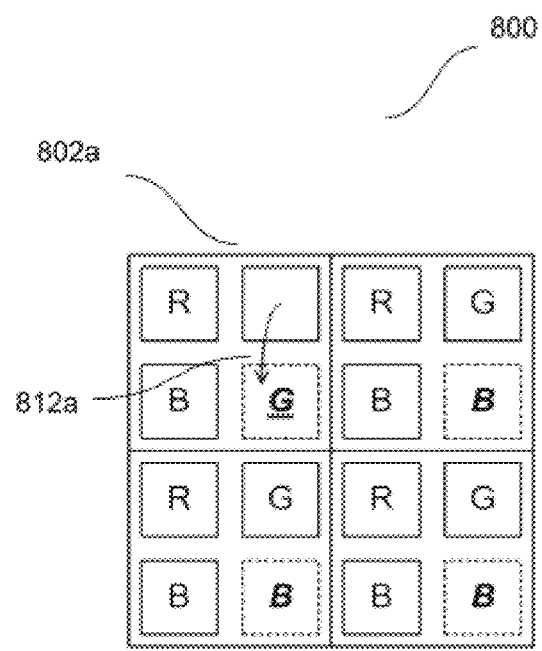
FIG. 8A (a)   FIG. 8A (b)

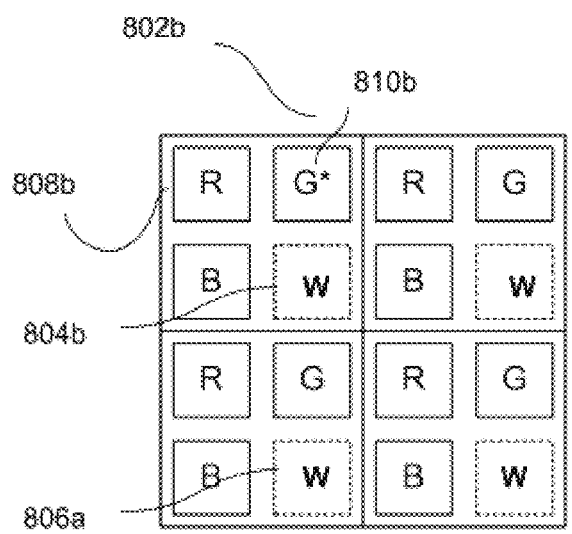
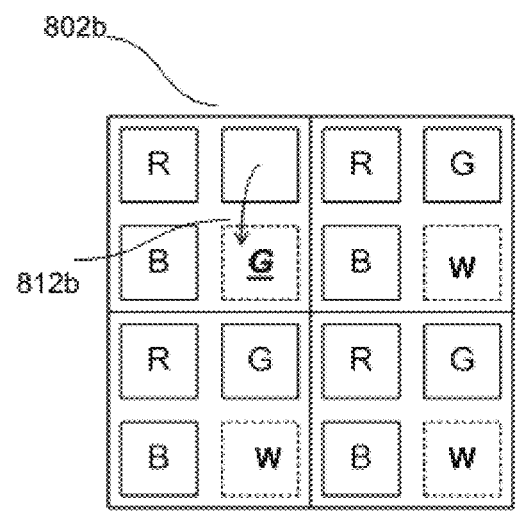
FIG. 8B (a)  FIG. 8B (b)

REPAIR TECHNIQUES FOR MICRO-LED DEVICES AND ARRAYS

CROSS-REFERENCE TO RELATED APPLICATION

This application claims the benefit of U.S. Provisional Application No. 62/556,608, filed Sep. 11, 2017, which is hereby incorporated by reference herein in its entirety.

FIELD OF THE INVENTION

The present disclosure relates generally to micro LED displays and, more particularly, provides repairing techniques for micro LED displays.

BACKGROUND

The micro-LED displays may suffer from several sources of defects including: device (micro-LED) open/short issues, device transfer/integration/bonding defects, and substrate driver pixel defects. Repair of micro-LED displays including defective micro devices transferred to the system substrate is very crucial to increase the yield. While using spare micro devices can increase the yield, it can increase the costs as well. The embodiments below are directed toward enabling repairing techniques to increase the yield and reduce the cost of emissive displays.

SUMMARY

Test and repair of micro LED displays including micro devices transferred to the system substrate is very crucial to increase the yield. While using spare micro devices can increase the yield, it can increase the costs as well. The embodiments below are directed toward enabling easy and/or practical repair processes to increase the yield and reduce the cost.

In accordance with one embodiment, a display system on a system substrate may be provided. The display system may comprising an array of pixels, wherein each pixel comprising a group of subpixels arranged in a matrix; the group of sub-pixels comprising at least one defective sub-pixel; and a defect mapping block to map data from the at least one defective sub-pixel to at least one surrounding spare sub-pixel.

In accordance with another embodiment, a method of repairing a pixel circuit comprising a plurality of pixels may comprising: providing a group of more than two sub-pixels and a spare sub-pixel for each pixel, detecting at least one defective sub-pixel in the group of the sub-pixels, and converting the spare sub-pixel with a color conversion or color filter to create a color same as that of the defected sub-pixel.

In a further embodiment, a method of repairing a pixel circuit may be provided. The method may comprising: providing a pixel comprises more than one primary sub-pixels with low-wavelength emission, applying a color conversion material to at least one of the primary sub-pixels to convert the low-wavelength emission into a different emission wavelength from the low-wavelength emission, identifying a defective sub-pixel in the primary sub-pixels; and mapping a spare sub-pixel to a same primary color as of the defective primary sub-pixel by using the color conversion material.

In accordance with yet another embodiment, a method of repairing a pixel circuit may be provided. The method may comprising: providing a pixel comprises more than one primary sub-pixels with combined wavelength emission, applying a color filter material to at least one of the primary sub-pixels to convert the combined-wavelength emission into a different emission wavelength; identifying a defective sub-pixel in the primary sub-pixels; and mapping the spare sub-pixel to the same primary color as of the defective primary sub-pixel by using the color filter material.

In accordance with some embodiment, a method of repairing a pixel circuit may be provided. The method may comprising providing a pixel comprises at least one low-wavelength primary sub-pixels, providing at least one spare sub-pixel with a same wavelength, identifying a defective sub-pixel in the primary and the spare sub-pixels; and mapping a color conversion layer to the sub-pixels without the defect so that there is at least on sub-pixel for each intended primary sub-pixels.

In accordance with another embodiment, a method of repairing a pixel circuit may be provided. The method may comprising providing a pixel comprises at least one combined-color sub-pixels, providing at least one spare sub-pixel with the same combined-color, identifying a defective sub-pixel in the primary and the spare sub-pixels; and mapping a color filter layer to the sub-pixels without the defect so that there is at least one sub-pixel for each intended primary sub-pixels.

In accordance with yet another embodiment, a method to replace defective sub-pixels with spare sub-pixels in a display system may comprising providing a periodic spatial variation to a position of sub-pixels in the display, calculating a maximum and a minimum distance between the spare sub-pixels and the defected sub-pixels, extracting a variation in coordinates of sub-pixels; and replacing the defective micro-devices with the spare sub-pixels based on the calculated variation.

In accordance with yet another embodiment, a method of correcting spatial non-uniformity of an array of optoelectronic devices wherein a part of the signals created or absorbed by the optoelectronic devices is blocked based on the spatial non-uniformity in said array.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and additional aspects and embodiments of the present disclosure will be apparent to those of ordinary skill in the art in view of the detailed description of various embodiments and/or aspects, which is made with reference to the drawings, a brief description of which is provided next.

FIG. 2a shows an example of a pixel array having one spare sub-pixel for each pixel.

FIG. 2b shows an example of a pixel array including transferring of a defective sub-pixel contribution to a spare neighboring subpixel.

FIG. 8Aa shows an example of pixel array with fixed RGB and a spare blue sub-pixel, wherein a defective green sub-pixel detected in the post-production inspection, FIG. 8Ab shows an example of pixel array with fixed RGB and a spare blue sub-pixel, wherein the spare blue sub-pixel converted to green.

FIG. 8Ba shows an example of pixel array with fixed RGB and a spare combined color sub-pixel, wherein a defective green sub-pixel detected in the post-production inspection, FIG. 8Bb shows an example of a pixel array wherein the spare combined color sub-pixel converted to green.

Figures 1A, 1B:
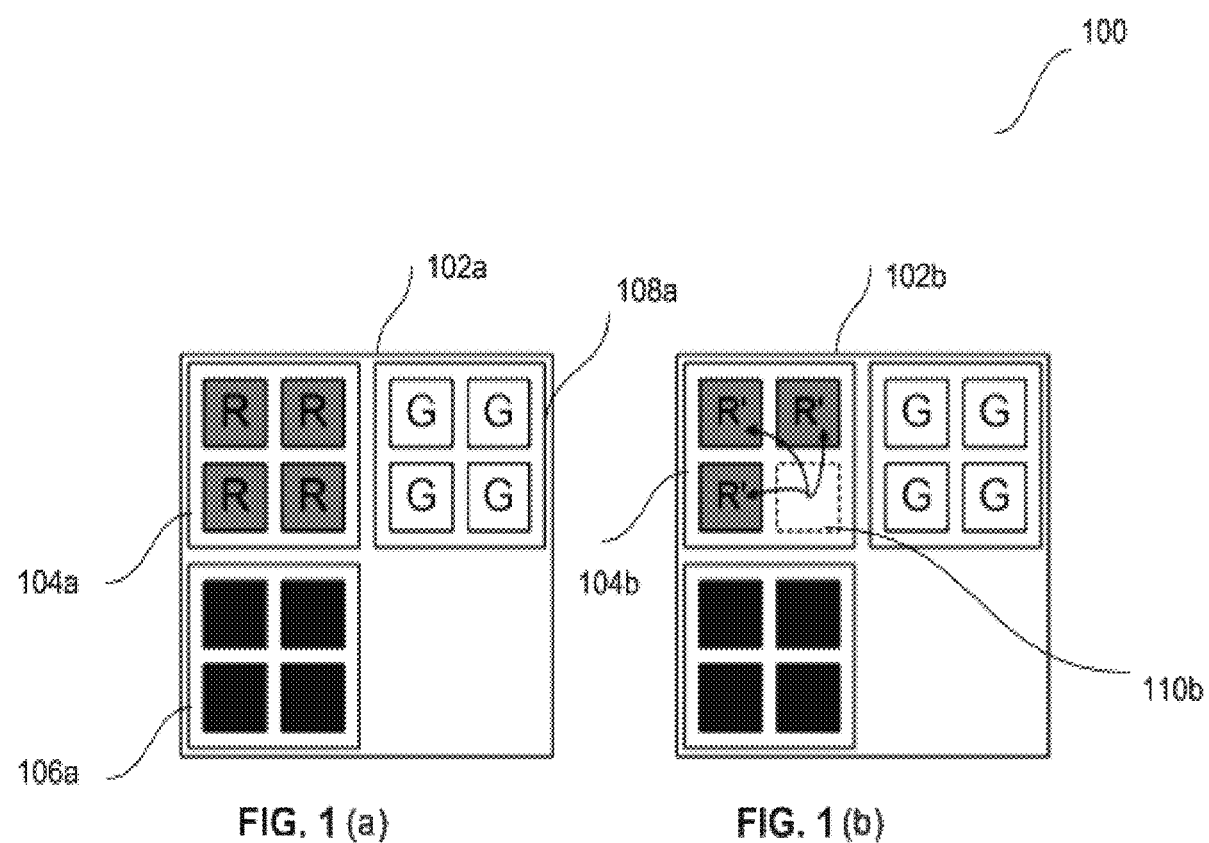
FIG. 1a illustrates an example of a pixel array including no defective sub-pixel.
FIG. 1b illustrates an example of a pixel array including transferring of a defective sub-pixel contribution to a spare subpixel.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

Defect Repair Techniques

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or element(s) as appropriate.

In micro device system integration, the devices are fabricated in their native ambient conditions, then they are transferred to a larger system substrate. In one case, the micro device is functional after being placed on the system substrate since it has functional connections to the system substrate. In another case, post processing is needed to make the device functional. common processing step includes creating connections between the micro device and the system substrate, in which case, the system substrate may be planarized first and a thick (1-2 micrometer) dielectric layer is deposited on top of system substrate. If needed, the contact areas to the micro devices are opened by patterning and etching the planarization layer. Thereafter, the electrode is deposited and patterned if needed.

In this description, the term "device" and "micro device" are used interchangeably. However, it is clear to one skill in the art that the embodiments described here are independent of the device size.

In this description, the term "spare device" and "redundant device" are used interchangeably. However, it is clear to one skill in the art that the "spare device" and "redundant device" analogous in meaning to a device that not strictly necessary to functioning but included in case of failure in another device.

The main challenge with such integration is to identify the defective transferred devices and repair them or the emissive display if needed. After the tests, the defective pixels are identified. The defective pixels either can be fixed or disabled. One way to repair a defect after identification is to remove the defective device from the pixel and replace it with a new one. The main drawback of doing this is the risk that the pixel might be damaged during removal of the defective device. Various repairing techniques embodiments in accordance with the structures and processes provided are described below in detail to conquer and mitigate the defected pixels.

Included are redundancy schemes comprising multiple redundancy, distributed redundancy, and defect mapping techniques. Other embodiments include repair by color conversion comprising fixed sub-pixels with redundant blue structure and all blue structure.

Here, the embodiments are described in the context of pixelated systems (e.g., display, sensors, and other array structure), however, similar approaches can be used for other system configurations. Moreover, although the embodiments illustrate techniques applied to micro devices, it is to be understood that they can be applied to any other device size.

In one approach illustrated in FIG. 1a, a pixel circuit 102a may comprising a plurality of pixels integrated on a system substrate (not shown in FIG. 1a) of a display system. Each pixel such as 104a, 106a and 108a may comprising a group of subpixels including a subpixel and a group of spare sub-pixels of same primary color. Each array of subpixels configured to emit separate primary color. E.g. a first group of subpixels 104a may emit red primary color, a second group of subpixels 106a may emit blue color and a third group of subpixels 108a may emit green color. Each sub-pixel may be a micro-LED.

In such system, when a subpixel e.g. subpixel is detected to be defective after the integration process, the luminance contribution of the defected subpixel 110b may be transferred to the spare ones 104b as shown in FIG. 1b. Each spare sub-pixel of each pixel may configured to emit a same primary color as of the defective sub-pixel.

In another embodiment as illustrated in FIGS. 2a and 2b, where it is desired to limit the quantity of integrated microdevices, a sparse redundancy such as the pattern illustrated in FIG. 2a may be utilized. In the system of FIG. 2a, a cluster of pixels (4 full pixels) may integrated on the substrate (not shown in FIG. 2a), wherein each cluster 202a may comprising a set of pixels and a set of spare subpixels and each pixel comprising a set of subpixels (R, G, B) and a spare subpixel e.g. 204a and 206a. In such system, when a subpixel 202b is detected to be defective after the integration process, the luminance contribution of the defected subpixel may be transferred to the spare neighbor 204b as shown in FIG. 2b.

In above approaches and embodiments, as the configuration has four micro-LED for each subpixels, and one of the micro-LED is not functional, the each one of the remaining micro-LED brightness will increase by ⅓ to compensate for the brightness loss caused by the defective micro-LED. The main issue with these approaches is that the number of micro-LEDs per display increases dramatically. As a result, the cost of the material increases as well. Thus, for some defect repair mechanisms where a display controller needs to redirect the data flow to the redundant circuits, defect mapping techniques are used. These techniques rely on using two or more redundant elements to artificially shift the effective coordinates of the repaired element within the constructed image.

Figure 3:
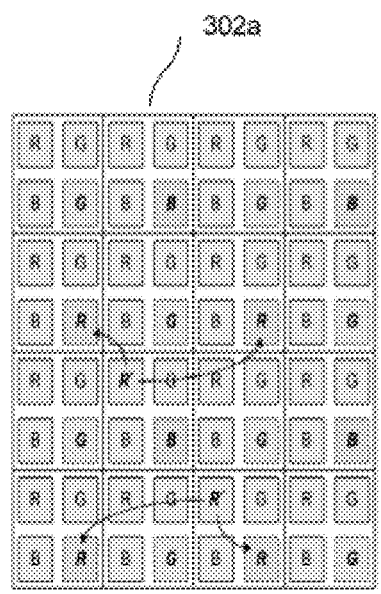
FIG. 3a-3c demonstrates a predefined mapping technique to repair defective micro devices.
Figure 3:
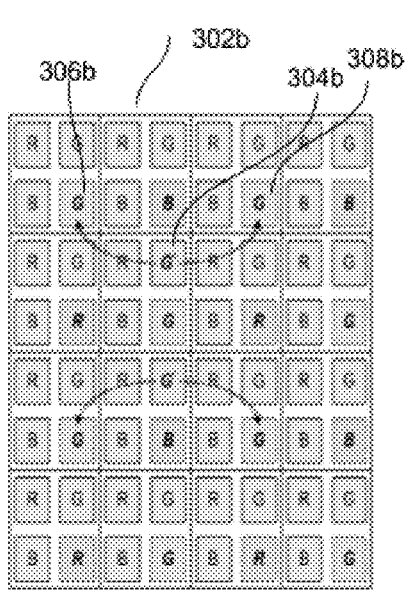
Figure 3:
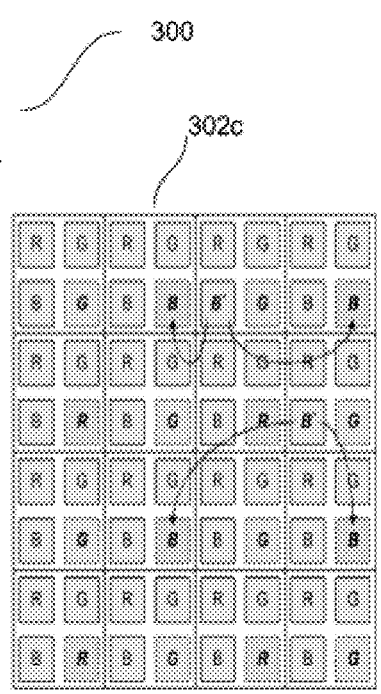

FIG. 3a-3c demonstrates a predefined mapping technique to repair defective micro devices. In one embodiment, a display system with an array of pixels and having at least one defected pixel in the array of pixels may utilize a predefined group of redundant elements. In this case, each defected micro-device is mapped to the one or more than one spare micro-devices in vicinity of the defected device. The functionality (e.g. the brightness) is shared between the mapped spare devices with predefined values. Thus, a brightness value of the defective sub-pixel is shared between surrounding spare sub-pixels based on predefined values. For example, as shown in 302b, a green defected subpixel 304b can be mapped to two adjacent space green micro-LED 306b and 308b. Each one of the spare ones 306b and 308b can produce 50% of the brightness for the defected green subpixel 304b. An example of this is shown in FIG. 3b. Similar approaches may be employed for red and blue defective sub-pixels as shown in 302a and 302c.

Figure 4:
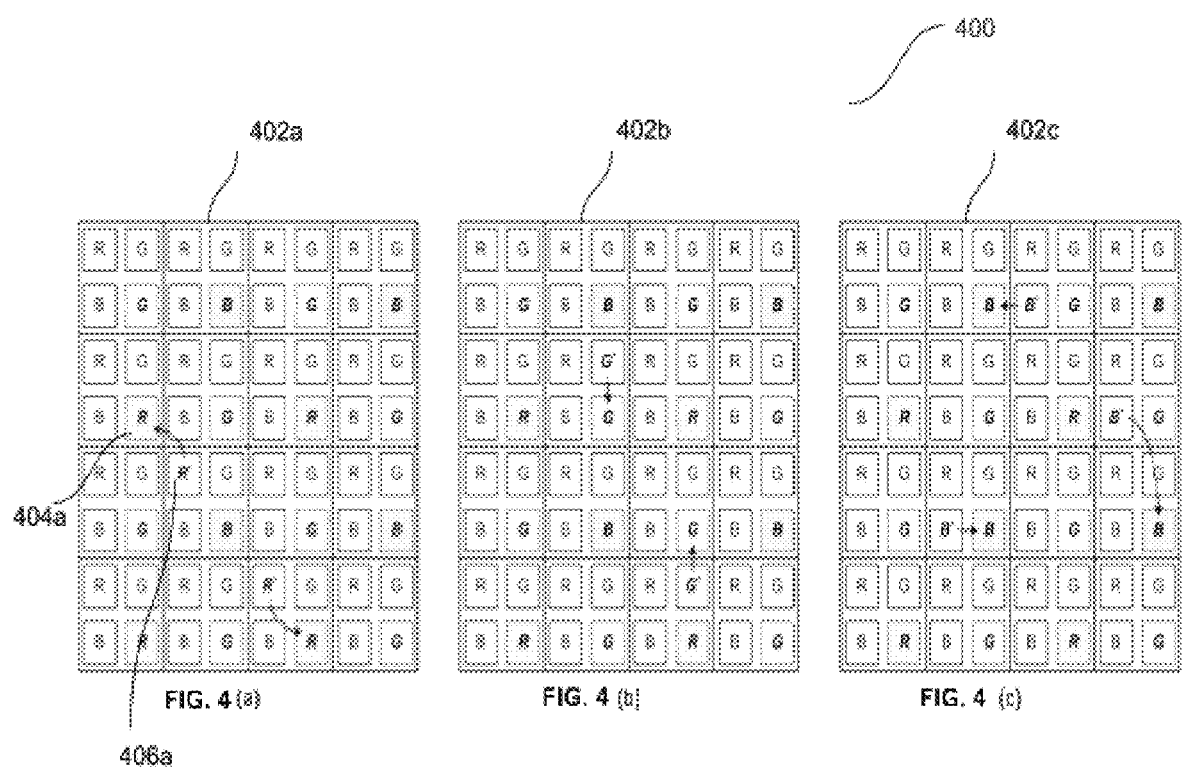
FIG. 4a-4c demonstrates a proximity mapping technique to repair defective micro devices.

In other embodiment, the brightness share of the spare devices is calculated based on a geometric distance between the defected pixel and the surrounding spare devices. Either a lookup table or a formula can be used to extract the brightness share of the surrounding spare devices. In one example, as shown in FIGS. 4a-4c, the spare device with shortest geometric distance from the defected subpixel creates 100% of the brightness. As illustrated in FIG. 4a, a display system 402a with an array of pixels and having at least one defected pixel 406a in the array of pixels may utilize the spare device 404a based on the shortest geometric distance between the defected pixel and the spare devices. Similar approaches may be employed for green and blue defective subpixels as shown in display systems 402b and 402c of FIGS. 4b and 4c, respectively.

Figure 5:
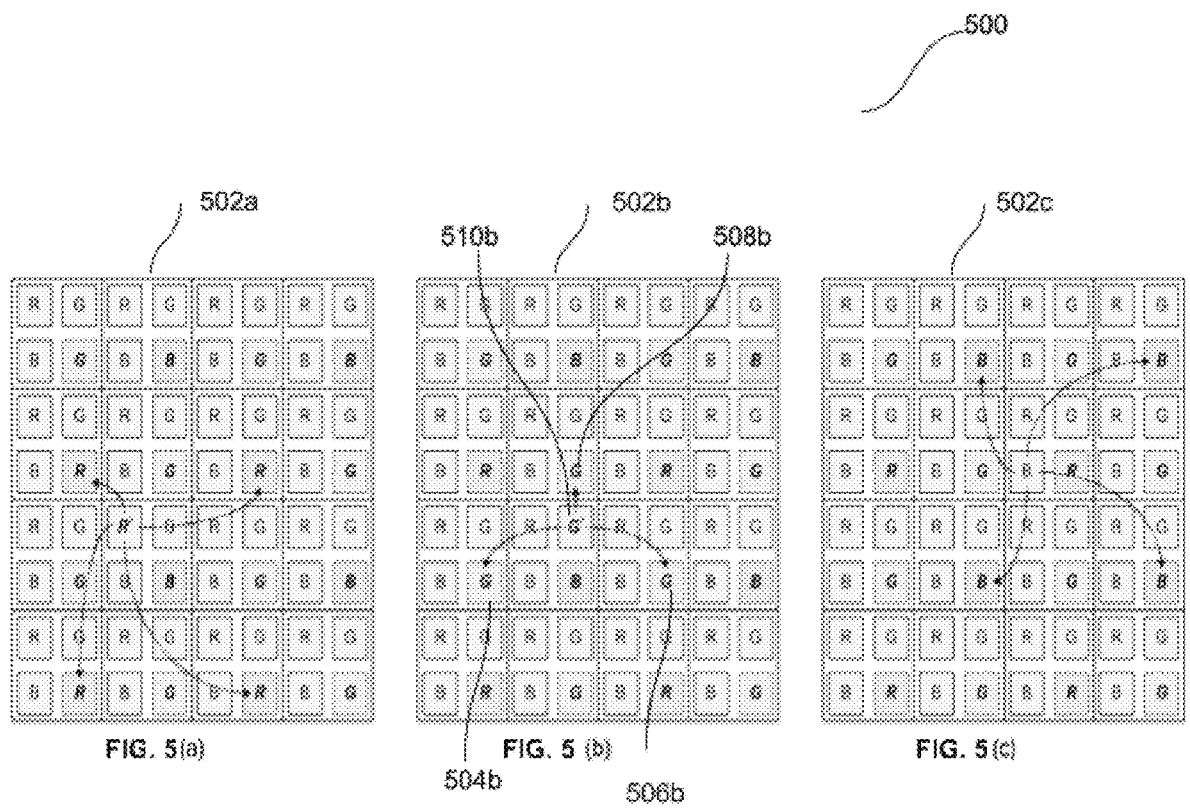
FIG. 5a-5c demonstrates a surround mapping technique to repair defective micro devices.

In another example, surround mapping techniques may be employed to repair defective micro devices as demonstrated in FIGS. 5a-5c. In one embodiment, a display system 502a comprising a plurality of subpixels and at least one defected pixel may utilize adjacent or surrounding spare devices equally. The brightness (or signal) of the defective devices is replaced by the adjacent devices equally. If there are three spare devices surrounding the defective device, the ⅓ of the brightness (or signal) is created by each spare device. In one example, as shown in FIG. 5b, three spare devices (504b, 506b and 508b) surrounding the defective green device 510b, the ⅓ of the brightness (or signal) is created by each spare device. The brightness (or signal) of the defective green device 510b is replaced by the adjacent spare green devices (504b, 506b and 508b) equally. Similar approaches may be employed for green and blue defective subpixels as shown in display systems 502a and 502c of FIGS. 5a and 5c, respectively.

Figure 6:
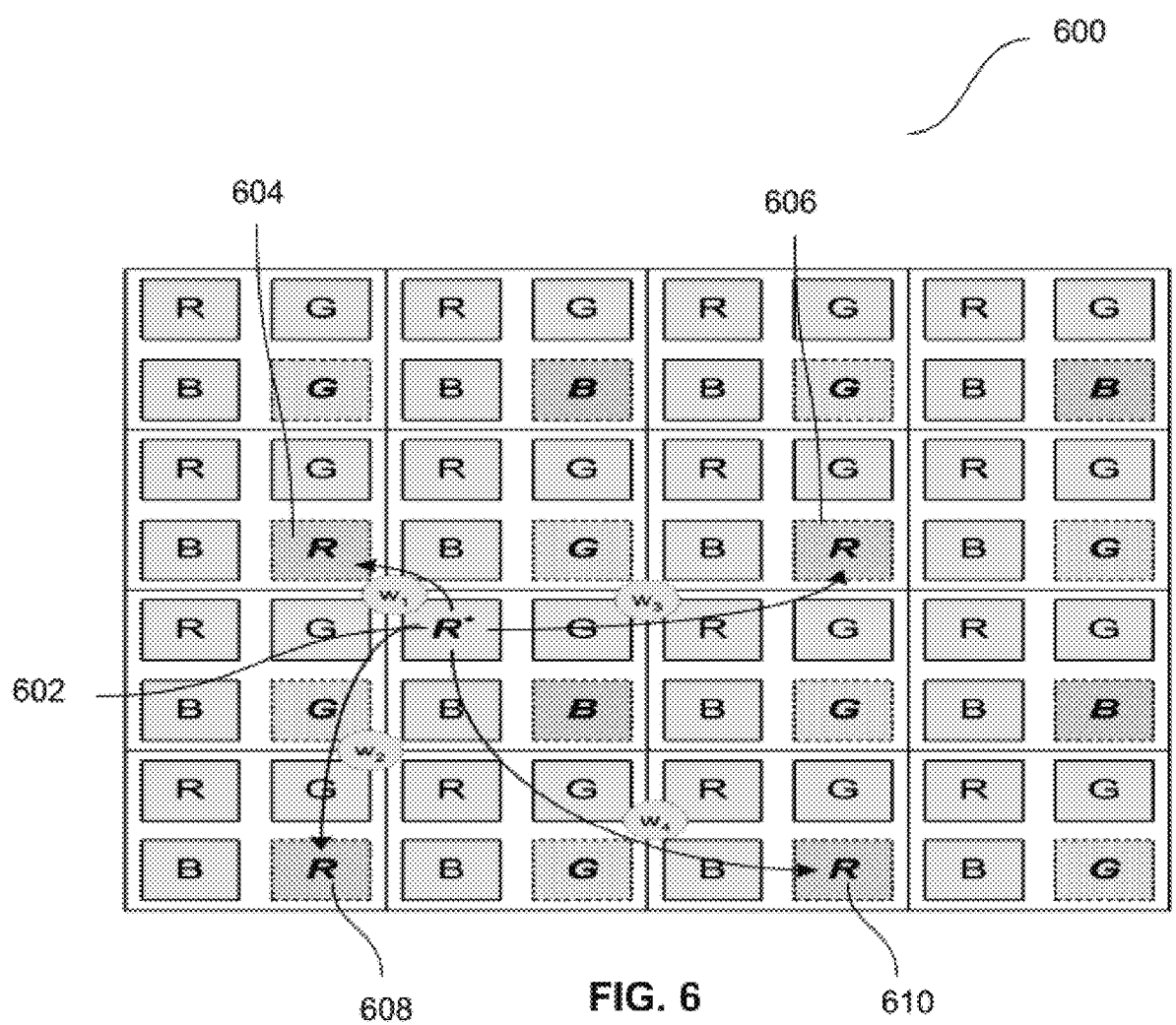
FIG. 6 demonstrates a weighted mapping technique to repair defective micro devices.

FIG. 6 demonstrates a weighted mapping technique to repair defective micro devices. In one embodiment, a display system 600 comprising a plurality of spare subpixels and at least one defected pixel 602 may utilize exact ratio of the geometric distance from the defected subpixel. The brightness share of each spare subpixel (604, 606, 608 and 610) is calculated based on the exact ratio of the geometric distance from the defected subpixel 602.

In another embodiment, any combination of these above embodiments may also feasible. The brightness in the above embodiments can be any other signal output from different micro devices.

Figures 7A, 7B, 7C:
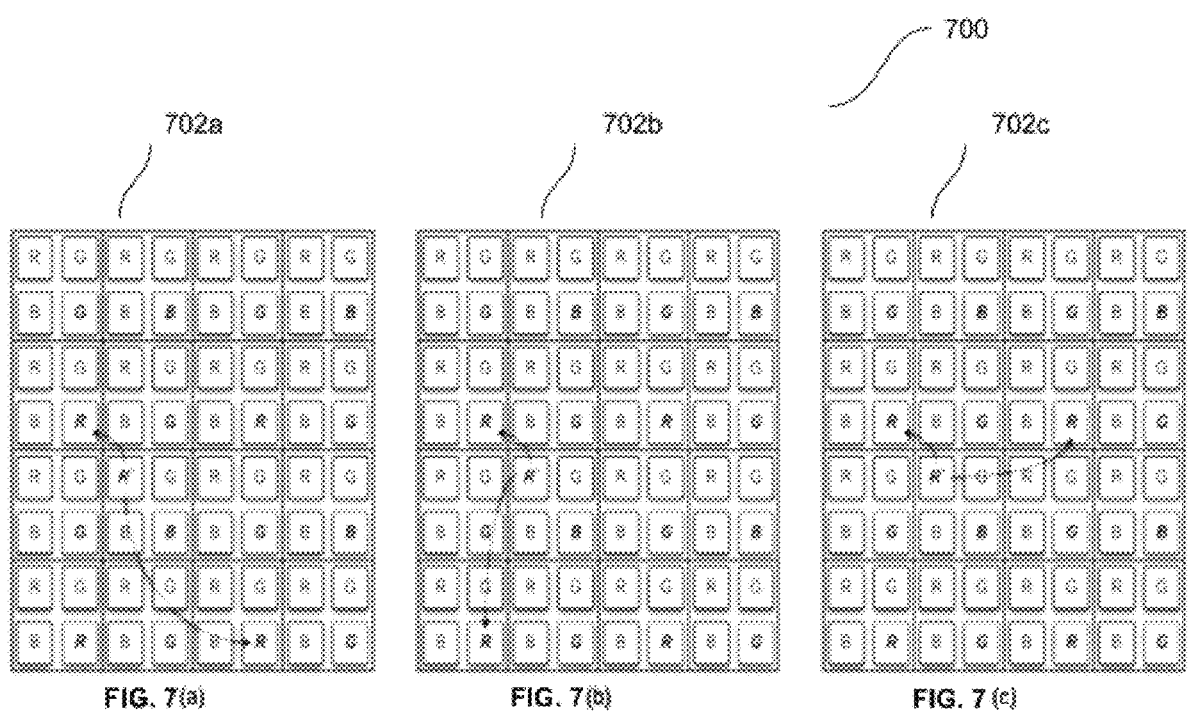
FIG. 7a shows a 2-dimensional distribution of spare elements distributed across rows and columns of the pixel array.
FIG. 7b shows a 1-dimensional distribution of spare elements distributed across rows and columns of the pixel array.
FIG. 7c shows a 1-dimensional distribution of spare elements distributed across the same or neighbor row in which the defect is detected.

There are many other approaches which can be utilized to repair the defective micro device. In one approach, in a display system 702a with an array of pixels, a 2-dimensional distribution of redundant elements distributed across rows and columns of the pixel array may be utilized as demonstrated in FIG. 7a. In another approach, in a display system 702b with an array of pixels, 1-dimensional distribution of redundant elements distributed across rows and columns of the pixel array may be utilized as shown in FIG. 7b. In yet another approach, in a display system 702c with an array of pixels, 1-dimensional distribution of redundant elements distributed across the same or neighbor row in which the defect is detected may be utilized as shown in FIG. 7c.

In yet another case, a display system with an array of pixels may utilizing above cases along with a buffer memory having a size corresponding to the number of rows occupied by the distributed redundancy in order to store and reuse the video/image data.

In another case, a display system with an array of pixels may utilizing above cases above along with a buffer memory having a size corresponding to a single row (where the defective pixel(s) are detected) in order to store and reuse the video/image data.

Defect mapping may be implemented in different levels/layers of a display system. In one embodiment, where a display system containing one or more defected pixel/subpixel, is repaired by physical mapping (e.g. post-fab laser repair) of the defected pixel/subpixel to a single or a group of spare/redundant repair elements.

In one embodiment, where a display system containing one or more defected pixel/sub-pixel, is repaired by driver mapping (i.e. programmable flash memory, OTP memory, or fuse in the driver component) of the defected pixel/subpixel to a single or a group of spare/redundant repair elements.

In yet other embodiment, where a display system containing one or defected pixel/sub-pixel, is repaired by soft mapping (i.e. mapping by the timing controller (TCON)) of the defected pixel/subpixel to a single or a group of spare/redundant repair elements. In another embodiment, where a display system containing one or more defected pixel/sub-pixel, is repaired by any combination of above embodiments.

Repair by Color-Conversion

In most cases, defected pixels may not be detected until after deposition of the display system common electrode. Accordingly, physical repair of defected elements may become challenging. Different embodiments illustrating several design approaches and manufacturing techniques may disclosed here to facilitate the repair process.

Fixed Sub-Pixels with Redundant Blue Structure

FIG. 8a shows a pixel array with fixed RGB and a redundant blue subpixel. In this embodiment 802a, every pixel may contain a fixed combination of sub-pixel elements (RBG, RGBW, or other combinations in stripe, diamond, or other patterns). Each pixel may further includes an extra Blue or a combined-color (e.g. white, orange, yellow, purple) subpixels (804a, 806a) which may be utilized for the repair purpose.

Once the integration, passivation, and common-electrode deposition steps are completed, the display panel may be inspected to detect and record the coordinates of defected pixels. The post-processing equipment in the manufacturing line may then cover (printing, patterning, or stamp) the redundant-blue subpixel with color-conversion material (Q-dot or Phosphor) to replace the defective subpixel or in case of combined-color device, color filter can be used to extract the color needed for the defective subpixel.

A 2×2 array 802a of such system using RGB subpixel components along with a spare blue sub-pixel is illustrated in FIG. 8Aa and FIG. 8Ab. Once a subpixel is detected to be defective in the array, then the spare blue colour may converted to same primary color as of the defective subpixel by use of color conversion material (FIG. 8A(b)). For example, a fixed RGB and a spare blue sub-pixel (804a, 804b) may be provided in a pixel 808a. During, the post-production inspection, if a defective green sub-pixel 810a is detected, the spare blue sub-pixel may be converted to green 812a using the color-conversion material.

FIG. 8Ba and FIG. 8Bb shows a pixel array 802b where redundant white subpixel converted to green. In case of the combined-color case shown in FIG. 8B, the spare device will be covered by a color filter to create the primary color (FIGS. 8Ba and 8Bb) as of the defective sub-pixel. For example, a fixed RGB and a spare white sub-pixel (804b, 806b) may be provided in a pixel 808b. During, the post-production inspection, if a defective green sub-pixel 810b is detected, the spare blue sub-pixel may be converted to green 812b using the color-conversion material. The blue or white are used as an example and can be replaced with other high energy photons or combined color.

All Blue or Combined-Color Structure

Figure 9:
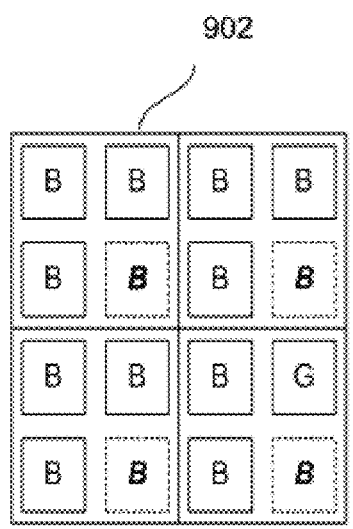
FIG. 9a-9c shows an architecture of pixel array populated by blue micro-devices.
Figure 9:
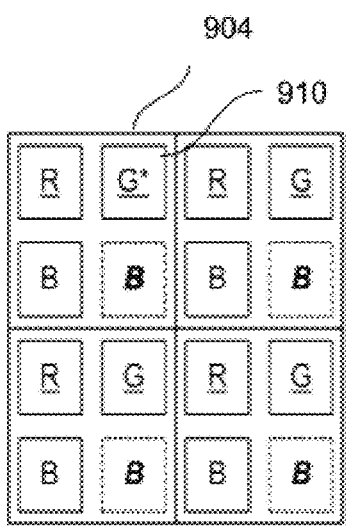
Figure 9:
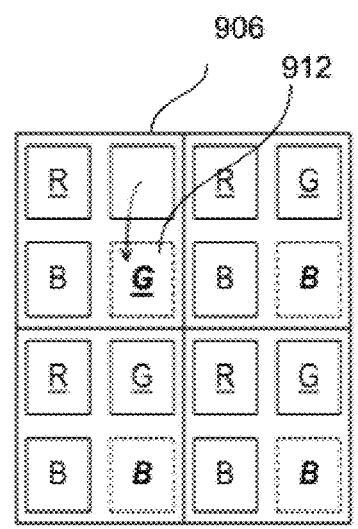

FIG. 9a-9c shows an architecture of pixel array populated by blue micro-devices. As shown in FIG. 9a, the entire array 902 may populated by one type of low-wavelength primary micro-device only (e.g. a blue or a combined color). The display system illustrated in FIG. 9(a) features an all-blue micro-LED array. Subsequently, the populated array may go through multiple post-integration processes, e.g. passivation, planarization, and common electrode deposition. An inspection system may then determine the coordinates of the defected pixels. As shown in FIG. 9(b)-(c), the display panel may then go through a production step where functional sub-pixels may be covered (printing, patterning, or stamp) by color-conversion (quantum dots, or Phosphor) or color-filter material to form the desired colored-pixel pattern (RGB, RGBW, RGBY, . . . ) using a fixed or spatially optimized mapping. In the same step of production, all defected pixels will be remapped by color converting the redundant blue sub-pixel. For example, as shown in FIG. 9a, an array 902 may be populated by all blue color sub-pixels. During, the post-production inspection, a defective green sub-pixel 910 is detected, the spare blue sub-pixel may be converted to green 912 using the color-conversion material.

In one embodiment, in case of combined-color device, color filter can be used to extract the color needed for the defective subpixel.

Spatial Coordinate Variation

In most of the repair process by redundancy or spare micro-devices, there is spatial coordinate difference between the actual defected device and the spare or redundant device. This can be perceived as visual artifacts. To address this issue, one embodiment of the invention adds predefined (or periodic) spatial coordinate variation to the devices. The variation can be either in one direction or both. Here, the maximum and minimum distance between the spare device and the possible represented defected device is extracted. Then, the variation in the coordinates is extracted to minimize the effect of the spare device location.

Figure 10A:
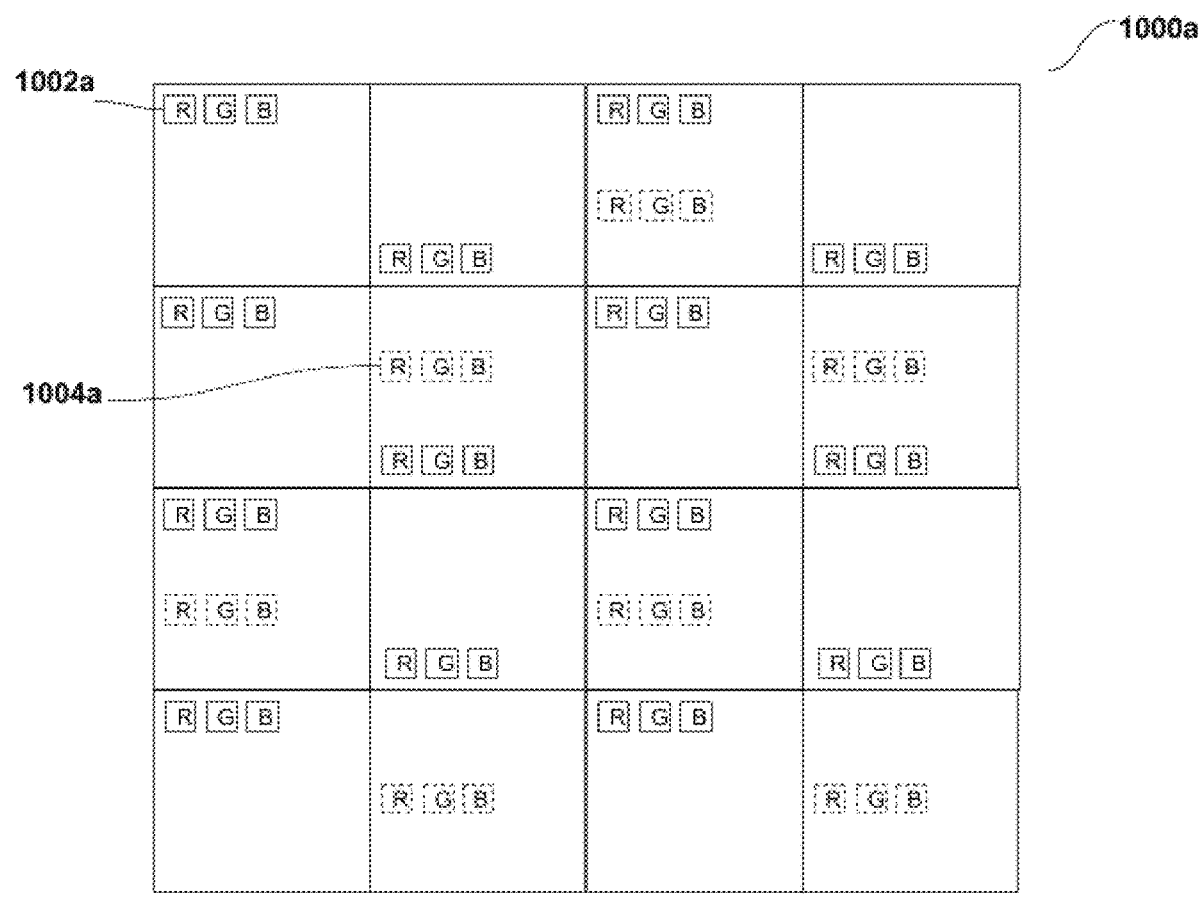
FIG. 10a shows a periodic spatial variation to the position of micro-devices in a display system.
Figure 10B:
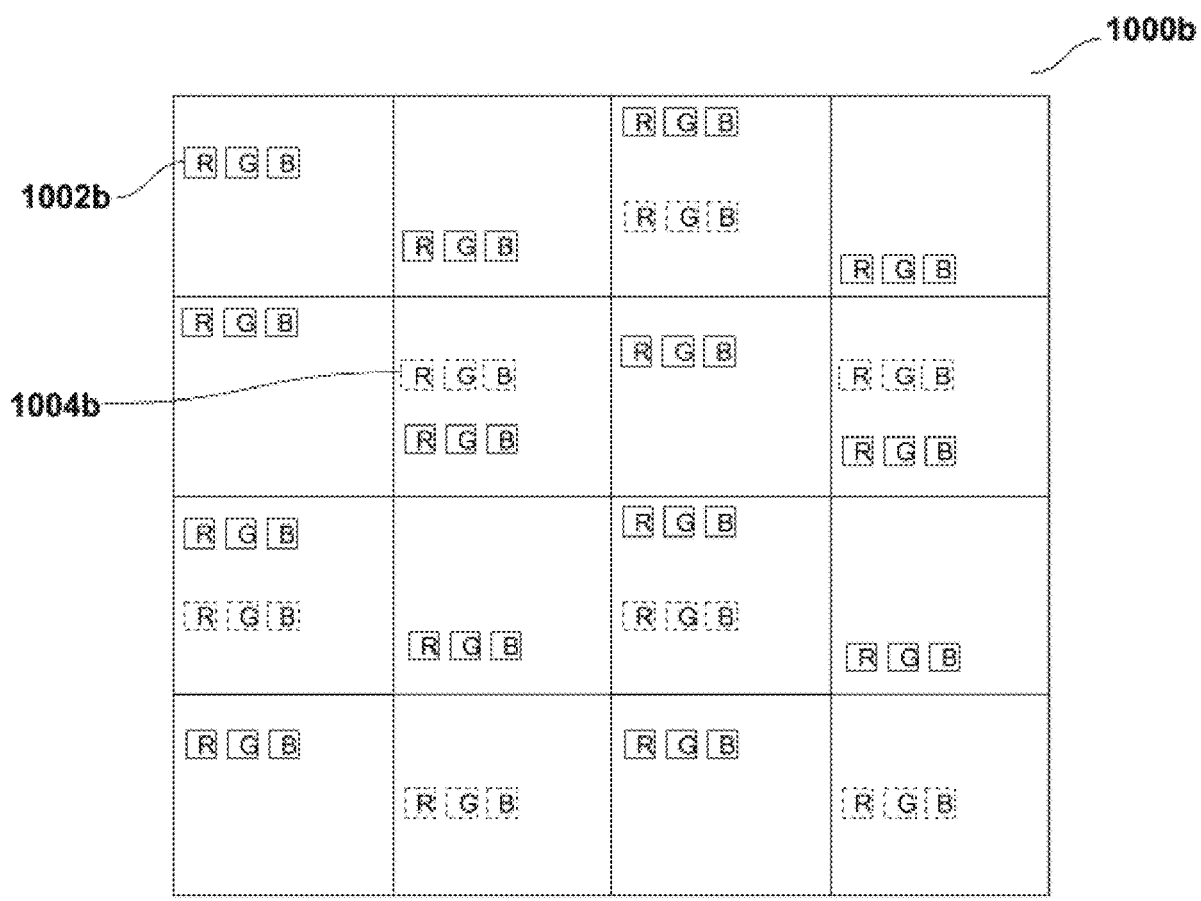
FIG. 10b shows a random spatial variation to the position of micro-devices in a display system.

FIG. 10a shows a periodic spatial variation to the position micro-devices 1002 in a display system 1000a using RGB. FIG. 10b shows another example, where random spatial variation is added to the micro-devices 1002b (e.g. R, G, B) in a display system 1000b. The same methods described in FIGS. 10a and 10b can be used to a display with different devices or a system with different functions. Here, the RGB devices 1002a has a horizontal orientation. However, they can have different orientation. Also, the spatial variation is applied to RGB samples 1002b in the same order. However, each device can have different spatial variation. Also, spare device 1004a is added to some spaces between the actual functional devices. The spare devices 1004b can have also spatial variation.

Figure 10C:
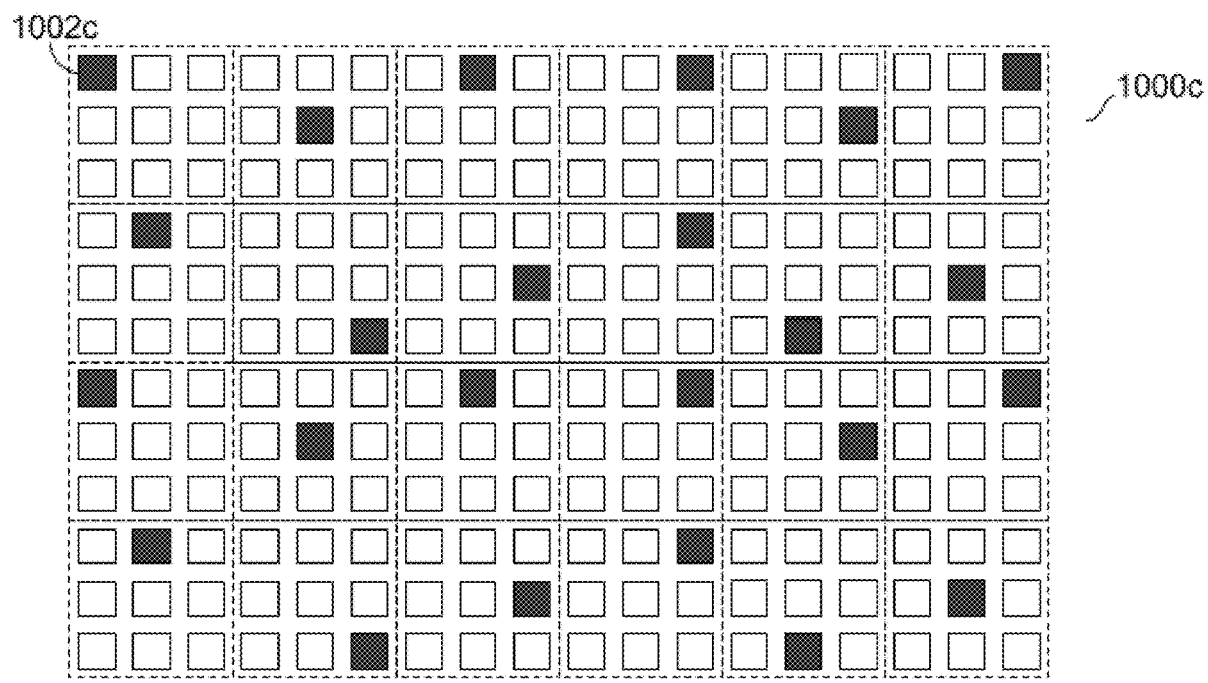
FIG. 10c shows an example of transferring different micro-devices from the source to the system substrate.

FIG. 10c shows an example of transferring different micro-devices from the source to the system substrate. In one approach, a method to create the spatial variation is to fabricate the micro-devices with induced spatial variation. Here, the system substrate 1000c where the micro-devices 1002c will be transferred after fabrication of micro devices have similar variation in the landing areas in the system substrate where the micro-devices will be transferred.

Figure 10D:
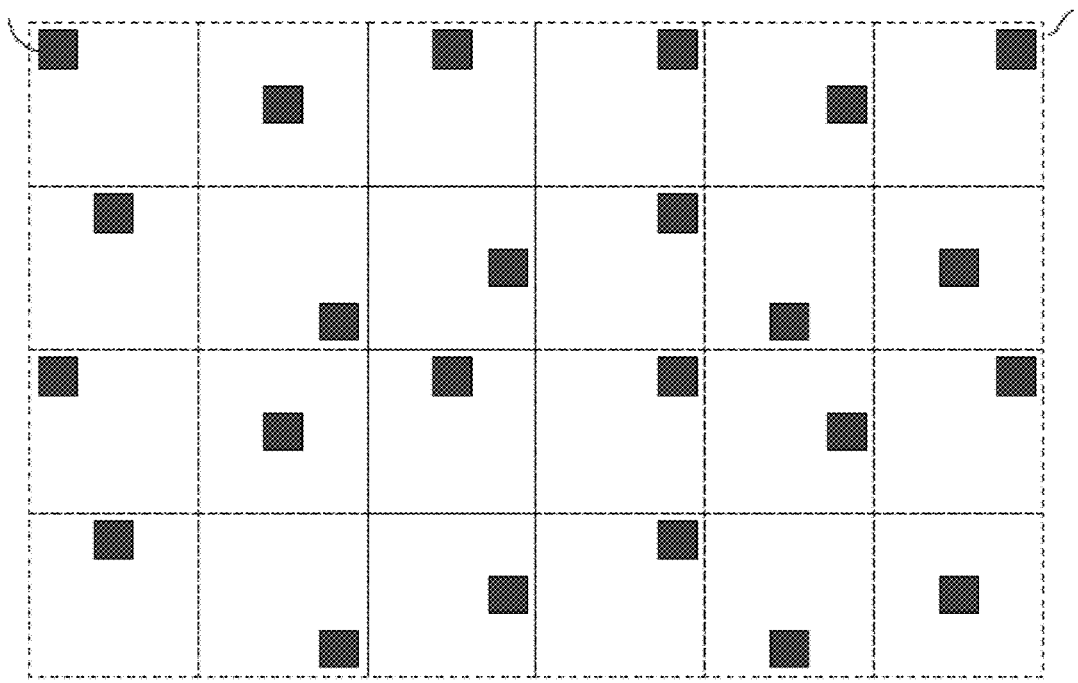
FIG. 10d shows a system substrate with landing area that corresponds to the variation in the micro-devices from the source.

FIG. 10d shows a system substrate with landing area array 1000d that corresponds to the variation in the micro-devices from the source. In another method, the transfer process accommodate the variation. Here, the micro-devices such as 1002d are sitting in a two-dimensional array structure which has smaller pitch than the pitch of the 2-dimensional landing-area array 1000d in the system substrate. The transfer method used here is a process of the transferring micro-devices with different pitch from the micro-device source into the landing array. Here, the landing array can accommodate different micro-device pitch. Either the landing area is large to accommodate such variation or the landing area has similar pitch variation.

In another embodiment, to further improve the uniformity, the induced variation is limited to the extend of allowable non-uniformity in the signals of the micro-devices. The allowable spatial non-uniformity can be global non-uniformity where it is calculated based on the average micro-device signals in areas that include more than one micro-devices. The allowable spatial non-uniformity can be local non-uniformity where it is based on the variation in perceived signals of adjacent micro-devices.

In yet another embodiment, to eliminate the unwanted non-uniformity induced by the variation in the coordination of the micro-devices, it may include a calibration of the system for the induced variation. The calibration may include modifying the signals of the micro-device based on the position of the micro-devices.

The orientation and place of the micro devices in pixels are used as an exemplary arrangement and different arrangements can be used for the aforementioned methods.

Figure 11:
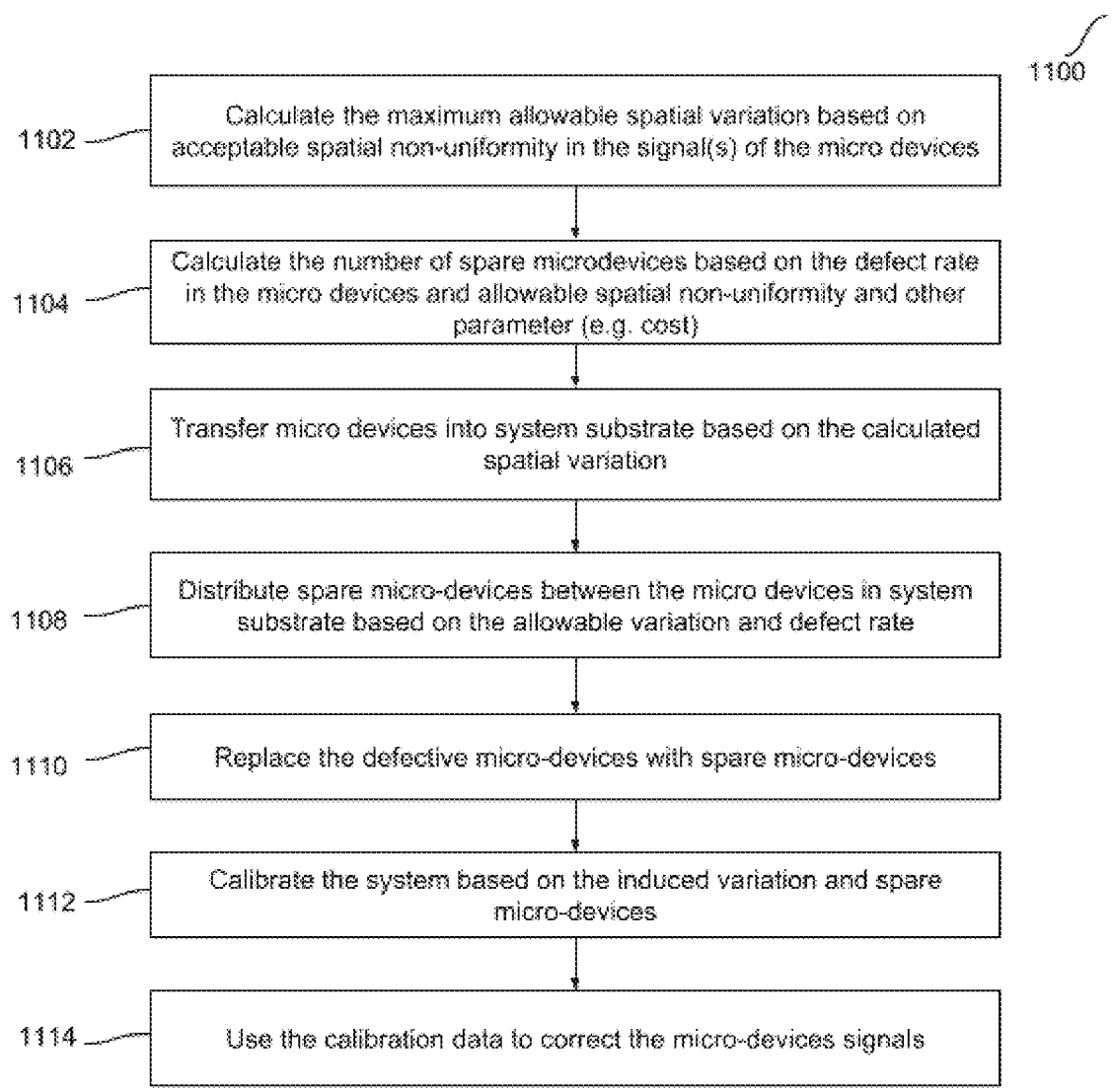
FIG. 11 demonstrated order of the steps to spatial variation to the position of micro-devices in a display system.

FIG. 11 demonstrates a flow chart 1100 including steps of creating the spatial variation and to eliminate the unwanted non-uniformity induced by the variation. The order of the steps demonstrated in FIG. 11 can be varied without affecting the system performance. FIG. 11 shows one example of the steps. First step 1102 includes calculating the maximum allowable spatial variation based on acceptable spatial non-uniformity in the signal(s) of the micro devices. During step 1104, the number of spare microdevices may be calculated based on the defect rate in the micro devices and allowable spatial non-uniformity and other parameter (e.g. cost). During step 1106, micro devices may be transferred into system substrate based on the calculated spatial variation and distribute the spare micro-devices between the micro devices in system substrate based on the allowable variation and defect rate during step 1108. During step 1110, replace the defective micro-devices with spare micro-devices. During step 1112, the system may be calibrated based on the induced variation and spare micro-devices and use the calibration data to correct the micro-devices signals during step 1114.

Figure 12:
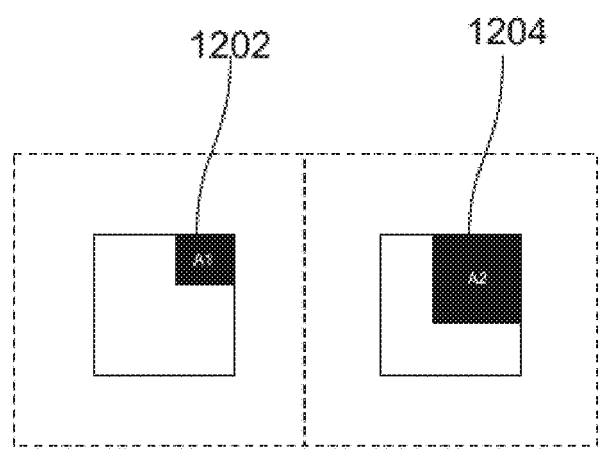
FIG. 12 shows a random spatial variation to the position of micro-devices in a display system.

FIG. 12 shows a method of correction for at least a portion of different non-uniformities such as the non-uniformity from the spatial variation, non-uniformity from the device process, non-uniformity from the system substrate or from the integration process of micro device into the system substrate. Here, part of the signals created or absorbed by the micro-devices is blocked. The area (A1) 1202 that blocks the signal is proportional to the signal of the micro-device.

In one embodiment, it is created before the transfer as part of either device process or integration process. If it is part of the device process, the micro device performance or the layers prior to creating micro devices is evaluated. After the evaluation, during the device process, either an opaque material is used to block the signal or the area A1 of the device is modified to area (A2) 1204 to correct for the measured non-uniformity in the performance.

In another embodiment, the blocked area 1204 is created after the device is transferred into the system substrate. In this case, the device performance is measured after transfer or prior to the transfer at different stages. Then, the data is used to create opaque layers that block of the signals or the area A2 of the device is tuned to correct of the measured non-uniformity in the performance.

In one embodiment, the opaque layer is deposited and patterned on top of a optoelectronic device where an area of the opaque layer is proportional to the spatial non-uniformity. The opaque layer may be a part of a contact layer of the optoelectronic device. In another case, the opaque layer is part of an electrode of the array. Also, a size of optoelectronic device size is modified according to the spatial non-uniformity.

In accordance with one embodiment, a display system on a system substrate may be provided. The display system may comprising an array of pixels, wherein each pixel comprising a group of subpixels arranged in a matrix; the group of sub-pixels comprising at least one defective sub-pixel; and a defect mapping block to map data from the at least one defective sub-pixel to at least one surrounding spare sub-pixel.

In accordance with some embodiment, a brightness value of the defective sub-pixel may shared between surrounding spare sub-pixels based on predefined values. A lookup table or a formula may used to extract the brightness share of the surrounding spare sub-pixels. A brightness value of the defective sub-pixel may shared to one of the surrounding spare sub-pixel with closest geometric distance from the defected subpixel. A brightness value of the defective sub-pixel may shared equally between the surrounding spare sub-pixels.

In accordance with another embodiment, a method of repairing a pixel circuit comprising a plurality of pixels may comprising, providing a group of more than two sub-pixels and a spare sub-pixel for each pixel, detecting at least one defective sub-pixel in the group of the sub-pixels, and converting the spare sub-pixel with a color conversion or color filter to create a color same as that of the defected sub-pixel.

In accordance with some embodiment, the group of sub-pixels may comprising a red sub-pixel, a green sub-pixel and a blue sub-pixel. The spare sub-pixel may comprising a blue sub-pixel or a combined-color sub-pixel.

In another case, the method may further comprising providing the color conversion material to convert the spare blue sub-pixel to the same primary color as of the defective sub-pixel. The color conversion material is one of: a quantum dot or a phosphor. The color conversion material may covered the spare blue sub-pixel by one of: a printing process, a patterning process or a stamping process.

In yet another case, the method may further comprising providing the color filter to convert the spare combined-color sub-pixel to the same primary color as of the defective sub-pixel.

A further embodiment provides a method of repairing a pixel circuit may be provided. The method may comprising: providing a pixel comprises more than one primary sub-pixels with low-wavelength emission (e.g. blue), applying a color conversion material to at least one of the primary sub-pixels to convert the low-wavelength emission into a different emission wavelength from the low-wavelength emission, identifying a defective sub-pixel in the primary sub-pixels; and mapping a spare sub-pixel to a same primary color as of the defective primary sub-pixel by using the color conversion material.

In accordance with yet another embodiment, a method of repairing a pixel circuit may be provided. The method may comprising providing a pixel comprises more than one primary sub-pixels with combined wavelength emission (e.g. white), applying a color filter material to at least one of the primary sub-pixels to convert the combined-wavelength emission into a different emission wavelength; identifying a defective sub-pixel in the primary sub-pixels; and mapping the spare sub-pixel to the same primary color as of the defective primary sub-pixel by using the color filter material.

In accordance with some embodiment, a method of repairing a pixel circuit may be provided. The method may comprising providing a pixel comprises at least one low-wavelength (e.g. blue) primary sub-pixels, providing at least one spare sub-pixel with a same wavelength, identifying a defective sub-pixel in the primary and the spare sub-pixels; and mapping a color conversion layer to the sub-pixels without the defect so that there is at least on sub-pixel for each intended primary sub-pixels.

In accordance with another embodiment, a method of repairing a pixel circuit may be provided. The method may comprising providing a pixel comprises at least one combined-color sub-pixels (e.g. white), providing at least one spare sub-pixel with the same combined-color, identifying a defective sub-pixel in the primary and the spare sub-pixels;

and mapping a color filter layer to the sub-pixels without the defect so that there is at least one sub-pixel for each intended primary sub-pixels.

In accordance with yet another embodiment, a method to replace defective sub-pixels with spare sub-pixels in a display system may comprising providing a periodic spatial variation to a position of sub-pixels in the display, calculating a maximum and a minimum distance between the spare sub-pixels and the defected sub-pixels, extracting a variation in coordinates of sub-pixels; and replacing the defective micro-devices with the spare sub-pixels based on the calculated variation.

In accordance with some embodiment, the extracting the variation in the coordinates of sub-pixels may comprising the steps of calculating a maximum allowable spatial variation based on a acceptable spatial non-uniformity in signals of the sub-pixels, calculating the number of spare sub-pixels based on a defect rate in the sub-pixels and the maximum allowable spatial non-uniformity, transferring sub-pixels into a system substrate based on the calculated spatial variation; and distributing the spare sub-pixels between the sub-pixels in system substrate based on the maximum allowable variation and the defect rate.

In accordance with other embodiments, the method may further comprising replacing the defective sub-pixels with spare sub-pixels, calibrating the system based on the induced variation and spare sub-pixels, and using the calibration data to correct the sub-pixels signals.

In accordance with yet another embodiment, a method of correcting spatial non-uniformity of an array of optoelectronic devices, wherein a part of the signals created or absorbed by the optoelectronic devices is blocked based on the spatial non-uniformity in said array.

In another case, an opaque layer is deposited and patterned on top of a optoelectronic device where an area of the opaque layer is proportional to the spatial non-uniformity. The opaque layer is part of a contact layer of the optoelectronic device. The opaque layer may part of an electrode of the array. Also, a size of optoelectronic device size is modified according to the spatial non-uniformity.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

I claim:

1. A display system on a system substrate comprising:
an array of pixels, wherein each pixel comprises a group of sub-pixels and a group of spare sub-pixels arranged in a matrix, each spare sub-pixel for each pixel is configured to emit a separate primary color, and at least one group of sub-pixels comprises at least one defective sub-pixel; and
a defect mapping block to map data from the at least one defective sub-pixel to at least one surrounding spare sub-pixel, wherein each spare sub-pixel for each pixel is configured to emit a same primary color as a corresponding sub-pixel for each pixel.

2. The display system of claim 1, wherein a brightness value of the defective sub-pixel is shared between surrounding spare sub-pixels based on predefined values.

3. The display system of claim 2, wherein one of a lookup table or a formula is used to extract the brightness share of the surrounding spare sub-pixels.

4. The display system of claim 1, wherein a brightness value of the defective sub-pixel is shared to one of the surrounding spare sub-pixel with closest geometric distance from the defected sub-pixel.

5. The display system of claim 1, wherein a brightness value of the defective sub-pixel is shared equally between the surrounding spare sub-pixels.

* * * * *